United States Patent [19]

Kondou et al.

[11] Patent Number: 5,757,717
[45] Date of Patent: May 26, 1998

[54] SEMICONDUCTOR CIRCUIT HAVING CIRCUIT SUPPLYING VOLTAGE HIGHER THAN POWER SUPPLY VOLTAGE

[75] Inventors: Ichiro Kondou; Hiroyuki Kobatake, both of Tokyo, Japan

[73] Assignee: NEC Corporation, Tokyo, Japan

[21] Appl. No.: 877,553

[22] Filed: Jun. 17, 1997

[30] Foreign Application Priority Data

Jun. 19, 1996 [JP] Japan .................. 8-158112

[51] Int. Cl.$^6$ .................................................. G05F 1/10
[52] U.S. Cl. ................... 365/230.06; 365/189.09; 327/536; 327/537
[58] Field of Search ................ 365/230.06, 189.09, 365/189.11; 327/536, 537, 534

[56] References Cited

U.S. PATENT DOCUMENTS 5,394,365 2/1995 Tsukikawa .................. 327/536
5,631,597 5/1997 Akaogi et al. ............... 327/536
5,701,096 12/1997 Higashiho ................... 327/537

FOREIGN PATENT DOCUMENTS 2-3192 1/1990 Japan.

*Primary Examiner*—David C. Nelms
*Assistant Examiner*—Vu A. Le
*Attorney, Agent, or Firm*—Whitham, Curtis & Whitham

[57] ABSTRACT

Disclosed herein is a semiconductor circuit includes a p-channel MOS transistor 110 whose source and drain path is connected between a word line 111 and a terminal 105 supplying a charging voltage higher than the power supply voltage and its back gate connected to a terminal 104 for supplying a back gate bias voltage VPB, in which the back gate bias voltage is applied to the back gate of the p-channel MOS transistor 110 so as to energize the p-channel MOS transistor 110 to supply the charging voltage VPM to the word line 111 when the word line 111 is selected, and to deenergize the p-channel MOS transistor 110 to supply the power supply voltage to the word line 111 when the word line 111 is not selected.

6 Claims, 10 Drawing Sheets

SEMICONDUCTOR CIRCUIT HAVING CIRCUIT SUPPLYING VOLTAGE HIGHER THAN POWER SUPPLY VOLTAGE

BACKGROUND OF THE INVENTION

1. Field of the Invention

The present invention relates to a semiconductor circuit, and more particularly to a semiconductor circuit having a circuit which can supply a voltage higher than a power supply voltage to an internal circuit.

2. Description of the Prior Art

In recent years, a low power consumption is being strictly demended of semiconductor circuits increasingly, and the power supply voltage employed to semiconductor circuits is being lowered accordingly. However, the operating speed of each transistor in the semiconductor circuits is reduced accompanying the drop in the operating voltage. Consequently, portions in circuits where high speed operation is especially required are often operated at voltages obtained by boosting the power supply voltage. For example, when a read voltage applied to gates of transistors constituting a memory cell goes down as a result of the dependence on the power supply voltage, a read rate of the memory cell is deteriorated. A means for resolving such a problem is disclosed in Japanese Laid-Open Patent Applications No. Hei 2-3192. This prior art will be described in detail with reference to FIG. 10.

A decoder circuit used in this flash EEPROM comprises a selection circuit, a voltage isolation circuit, and a charging circuit.

The selection circuit is comprised of a NAND gate 907, a NOT gate 908, and n-channel MOS transistors 949 and 950. The NAND gate 907 receives an address signal 906, its output is connected to the NOT gate 908 and the gate terminal of the n-channel MOS transistor 950, and the output of the NOT gate 908 is connected to the gate terminal of the n-channel MOS transistor 949. An address signal 947 is input to the drain terminal of the n-channel MOS transistor 949, and the source terminal of the n-channel MOS transistor 949 and the drain terminal of the n-channel MOS transistor 950 are connected, serving as the output of the selection circuit.

The voltage isolation circuit consists of an n-channel MOS transistor 909, with its gate terminal connected to a power source 917, its source terminal connected to the output of the selection circuit, and its drain terminal serving as the output of the voltage isolation circuit.

The charging circuit comprises n-channel MOS transistors 942 and 943, and capacitors C0 and C1. A terminal 948 supplies a charging voltage Vpp, and a terminal 946 supplies a clock φ for writing charge. The terminal 946 is connected to one terminal of the capacitor C1, and the source terminal of the n-channel MOS transistor 943. The n-channel MOS transistor 942 is connected to one terminal of the capacitor C0, the source terminal of the n-channel MOS transistor 943, and the output of the voltage isolation circuit, and the terminal of the capacitor C0 serves as the output of the decoder circuit 901.

The charging voltage Vpp is generated from the power supply voltage by means of a booster circuit. An example of the booster circuit is shown in FIG. 6. In this booster circuit, a plurality of n-channel MOS transistors 606 and an n-channel MOS transistor 608, with their respective gate terminals connected to their respective drain terminals, are connected in series. Every one terminal of a plurality of capacitors 607 is connected to the drain terminal of every transistor 606, and the other terminal of every capacitor 607 is supplied alternately with two kinds of clock signals generated by means of logic gates 609, 610, and 611 from the clock signal φ supplied through a terminal 601. The charging voltage Vpp is generated from the power supply voltage by controlling the voltage of the output 603 of the serial connection of the transistors 606 with a serially connected circuit of n-channel MOS transistors 605. Here, the charging circuit is actuated when a signal READ supplied to a terminal 602 is at logically "H" level.

Outputs of respective decoder circuits are connected to respective word lines X0 to Xn of a memory cell array 902 formed by arranging memory cells 914 in matrix form. Source terminals of all memory cells are connected in common to a terminal 939 which supplies a voltage Vs. Columns of the memory cell array 902 are input to a sense amplifier 903 as digit lines D0 to Dm, and the memory contents of the memory cells are output to a sense output 913.

Next, the operation of the device in FIG. 10 will be described with reference to FIG. 11.

When all the inputs to the NAND gate 907 go to the power supply voltage as a result of a change in the address signal 906, the output of the gate 907 goes to the ground potential (FIG. 11 1̂), and in response to this, the output of the NOT gate 908 goes to the power supply voltage (FIG. 11 2̂). Following this, the n-channel MOS transistor 950 is deenergized and the n-channel MOS transistor 949 is energized. If the voltage of the power source 917 and the threshold voltage of the n-channel MOS transistor 909 are called Vdd and Vtn909, respectively, the corresponding word line X0 911 is charged up to Vdd-Vtn909 via the n-channel MOS transistor 909 since an address signal 947 is selected and is at "H" level (FIG. 11 3̂, 4̂). After this, when a high voltage pulse is given by a change in the charging voltage Vpp, the potential of the word line 911 is boosted by an amount C0/(C0+CE)*Vpp from Vdd-Vtn909 (FIG. 11 5̂), where CE is the parasitic capacitance of the word line 911. As a result, the potential of the digit line 912 is changed by the memory contents of the memory cell selected by the address change (FIG. 11 6̂), and the sense amplifier 903 detects and amplifies the potential of the digit line 912 and outputs it as the sense output 913 (FIG. 11 7̂). Since a voltage higher than the power supply voltage is applicable to the word line in this manner, it is possible to secure a sufficiently high current for the memory cells and improve the operating speed of the memory cell array even when the power supply voltage Vdd is low.

However, the prior art under discussion has aproblem in that when a voltage higher than the power supply voltage is given to the word line, the supply of the high voltage pulse generated in the booster circuit from the power supply voltage is carried out by outputting it to the terminal 948 in FIG. 10. Namely, the pulse supplied to the terminal 948 in FIG. 10 has to charge and discharge the parasitic capacitor of the terminal 948 every time when the pulse rises and falls. Accordingly, the speed of rise and fall of the pulse is lowered which brings about deterioration in the read rate of data from the memory cells. In order to prevent such a drop in the read rate, a booster circuit having a large current supply capacity is required to charge the terminal 948 to the voltage Vpp at high speed. Moreover, since the boosting is performed in the booster circuit by transferring the charge by means of capacitors and a clock, large capacitors are needed for the booster circuit in order to realize a booster circuit with high current driving capability. Consequently, a booster circuit having a big current supply capability will induce an increase the space factor on the semiconductor substrate. This problem is more conspicuous as the power supply voltage is lower.

Moreover, in this example the potential of the selected word line is boosted by means of the coupling capacitance, so that it is necessary to provide the capacitor C0 for every word line, which brings about an increase in the space factor on the semiconductor substrate.

Furthermore, the boosted voltage of the word line is represented by Vpp+(Vdd-Vtn) so that even if the voltage Vpp is chosen to be independent of the power supply voltage Vdd, it depends on the power supply voltage Vdd after all. Besides, since the power supply voltage Vdd is varied by such a factor as the noise generated when other circuits are operated, the voltage supplied to the word line is varied accordingly, becoming a cause of malfunction.

SUMMARY OF THE INVENTION

It is therefore the object of the present invention to provide a semiconductor circuit having a smaller space factor which enables a high speed operation.

The semiconductor circuit according to this invention includes a first node to which is applied a first voltage higher than the power supply voltage, a second node for applying the first voltage to an internal circuit, and a transistor connected between the first node and the second node and receives a back gate bias voltage different from the first voltage to its back gate, and it is characterized in that the operating threshold of the transistor is so increased by the back gate bias voltage as to be energized when a second voltage lower than the power supply voltage is applied to the gate and deenergized when the power supply voltage is applied to the gate.

In this invention, the threshold voltage of the transistor connected to the second node is raised by supplying the back gate bias voltage to the back gate of the transistor. With the rise in the threshold voltage, it is possible to raise the first voltage being the charging voltage supplied to the word line via the transistor to above the power supply voltage without change in the amplitude of the "H" level voltage input to the gate terminal of the transistor. In other words, it is possible to control the application of the charging voltage to the internal circuit by the mere application of a voltage between the ground potential and the power supply voltage to the gate terminal of the transistor.

BRIEF DESCRIPTION OF THE DRAWINGS

The above and other objects, advantages, and features of the present invention will be more apparent from the following description taken in conjunction with the accompanying drawings, in which.

DESCRIPTION OF THE PREFERRED EMBODIMENTS

Figure 1:
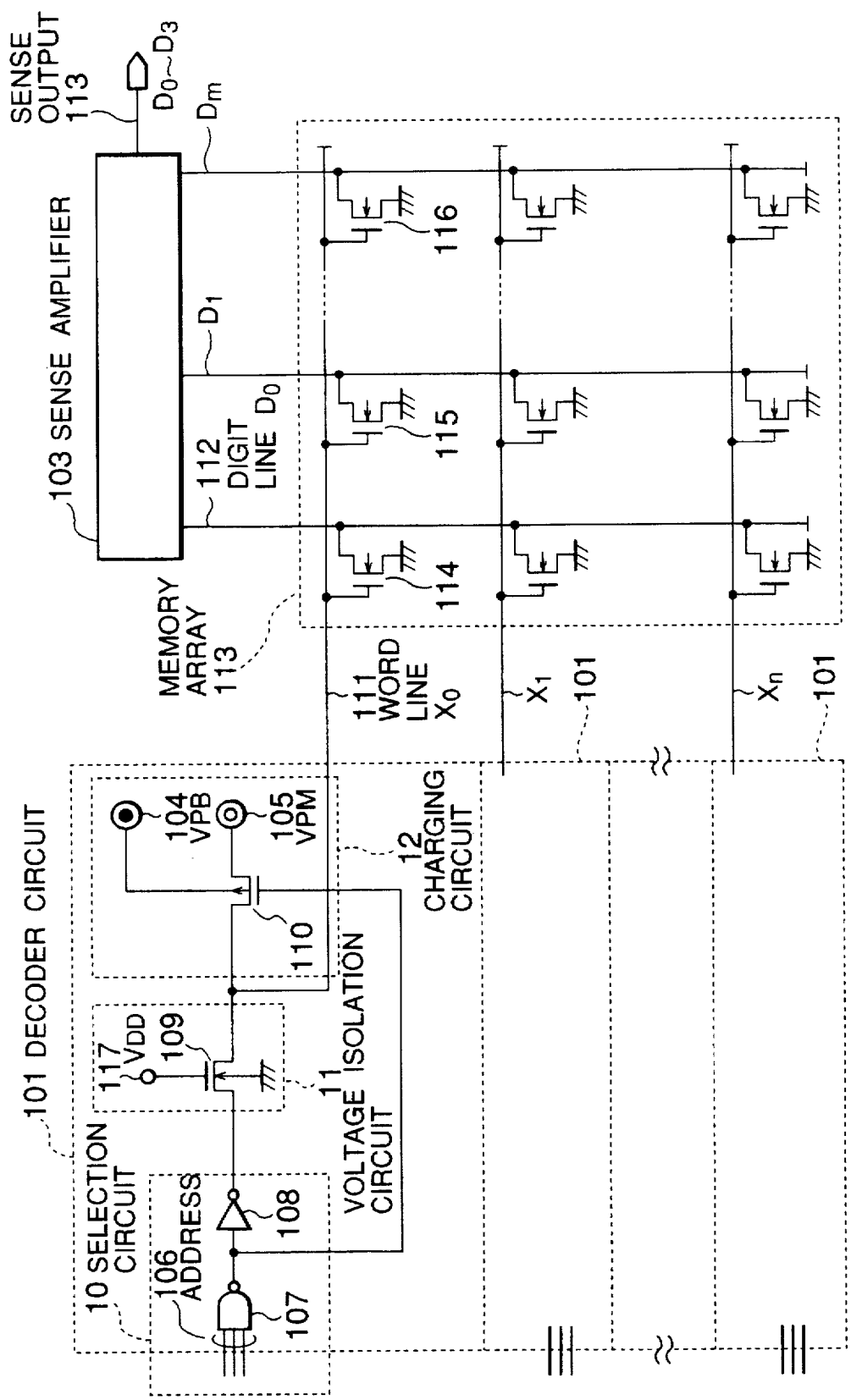
FIG. 1 is a circuit diagram of the semiconductor circuit according to a first embodiment of the invention.

Referring to the drawings, the embodiments of this invention will be described next.

Figure 7:
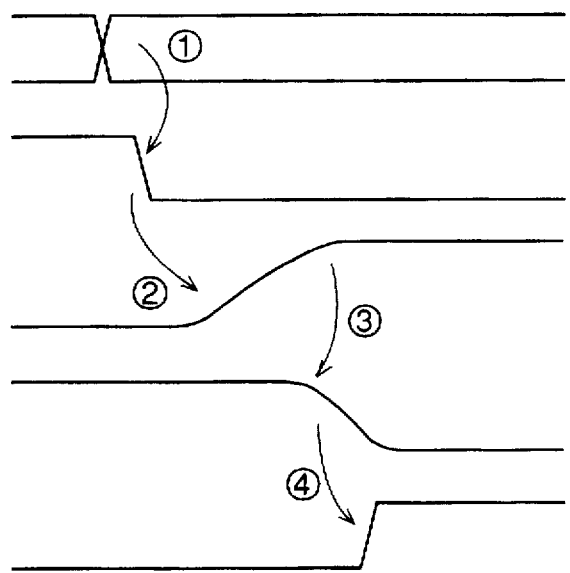
FIG. 7 is a timing chart showing the operation of the first embodiment of the invention.

An example of application of this invention to a read only memory (ROM) will be described with reference to FIG. 1. A timing chart for its operation is shown in FIG. 7.

A semiconductor memory which is the first embodiment of this invention includes a selection circuit 10, a voltage isolation circuit 11, and a charging circuit 12.

The selection circuit 10 comprises a NAND gate 107 which receives an address input 106 and is operated under a power supply voltage Vdd, and a NOT gate 108 which is operates by receiving the output of the gate 107.

The voltage isolation circuit 11 is made of an n-channel MOS transistor 109 which receives the power supply voltage Vdd to the gate terminal as a control signal for all time, has its back gate connected to the ground potential, and has one of the source and drain terminals connected to the output of the selection circuit and the other terminal serving as its output.

Figure 2:
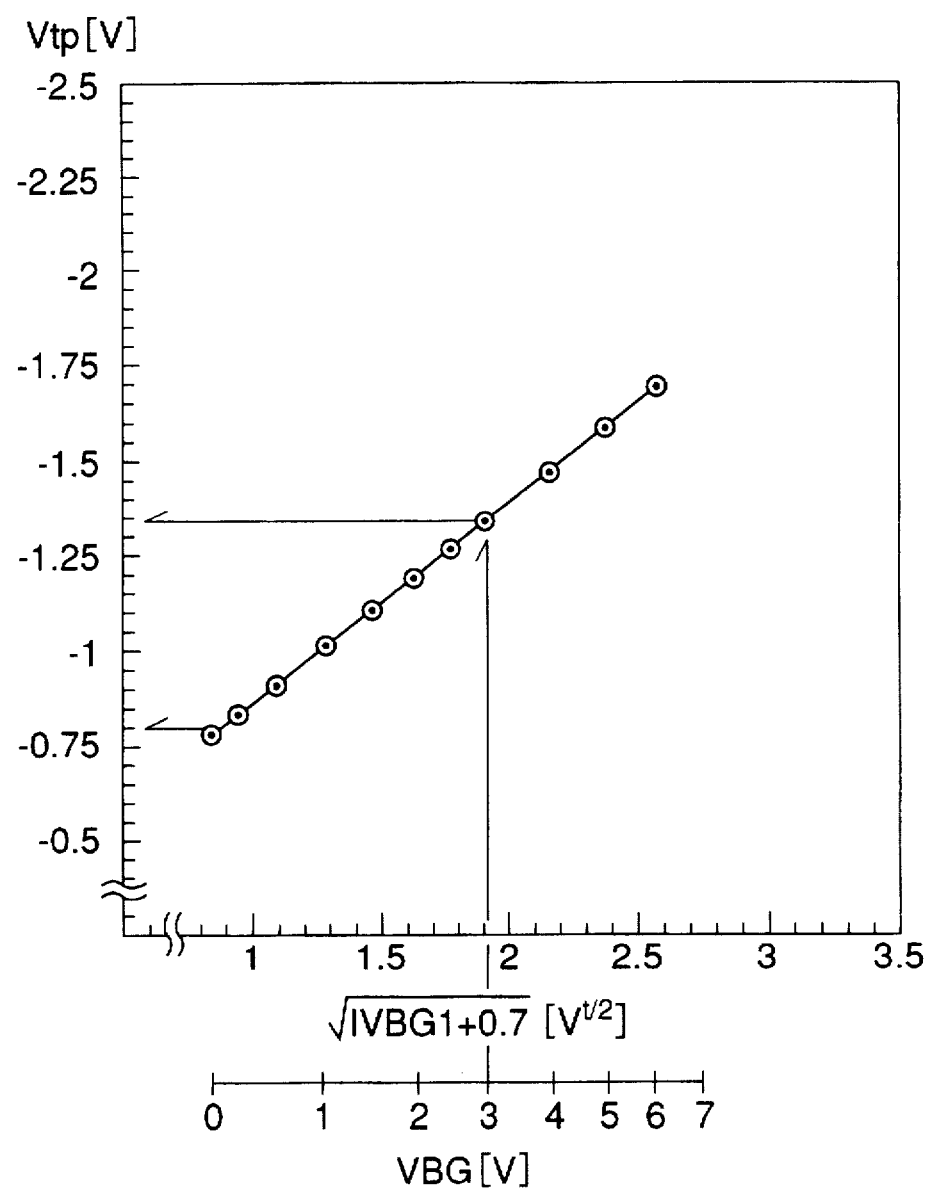
FIG. 2 is a characteristic diagram of the back gate effect of a p-channel MOS transistor.

The charging circuit 12 consists of a p-channel MOS transistor 110, with its back gate connected to a terminal 104 supplying the back gate bias voltage VPB, its source terminal connected to a terminal 105 supplying the charging voltage VPM, its gate terminal connected to the output of the NAND gate 107, and the output of its drain terminal served as the output. The threshold voltage of the p-channel MOS transistor 110 is varied by the back gate bias voltage VPB applied to the back gate and the charging voltage VPM applied to the source terminal. This is caused by the so-called back gate effect, and the relation between the back gate voltage |VBG|, where VBG=VPB−VPM, and the threshold voltage Vtp of the p-channel MOS transistor is represented in FIG. 2 by taking the former on the abscissa and the latter on the ordinate. In the figure, however, the square root of the sum of the back gate voltage |VBG| and the initial threshold 0.7[V] is taken as the abscissa in order to make the graph easier to look at. The graph shows that an almost linear relationship exists between these two quantities. To explain the back gate effect by taking an example, when |VBG| varies from 0 to 3[V], the threshold varies from −0.8 to −1.35[V], for example. As is clear from FIG. 2, the variation in the threshold is appropriately changeable by the back gate potential applied.

The output of the decoder circuit 101, namely, the drain terminal of the p-channel MOS transistor 110, is connected to a word line 111, and n-channel MOS transistors 14, 115, 116 and the like arranged in matrix from constitute a memory cell array 102. Respective memory cells 114 and the like are connected to digit lines 112 and the like, and these digit lines are connected to a sense amplifier 103 to output a sense output, in this embodiment 4 bits of 00–03.

Figure 5:
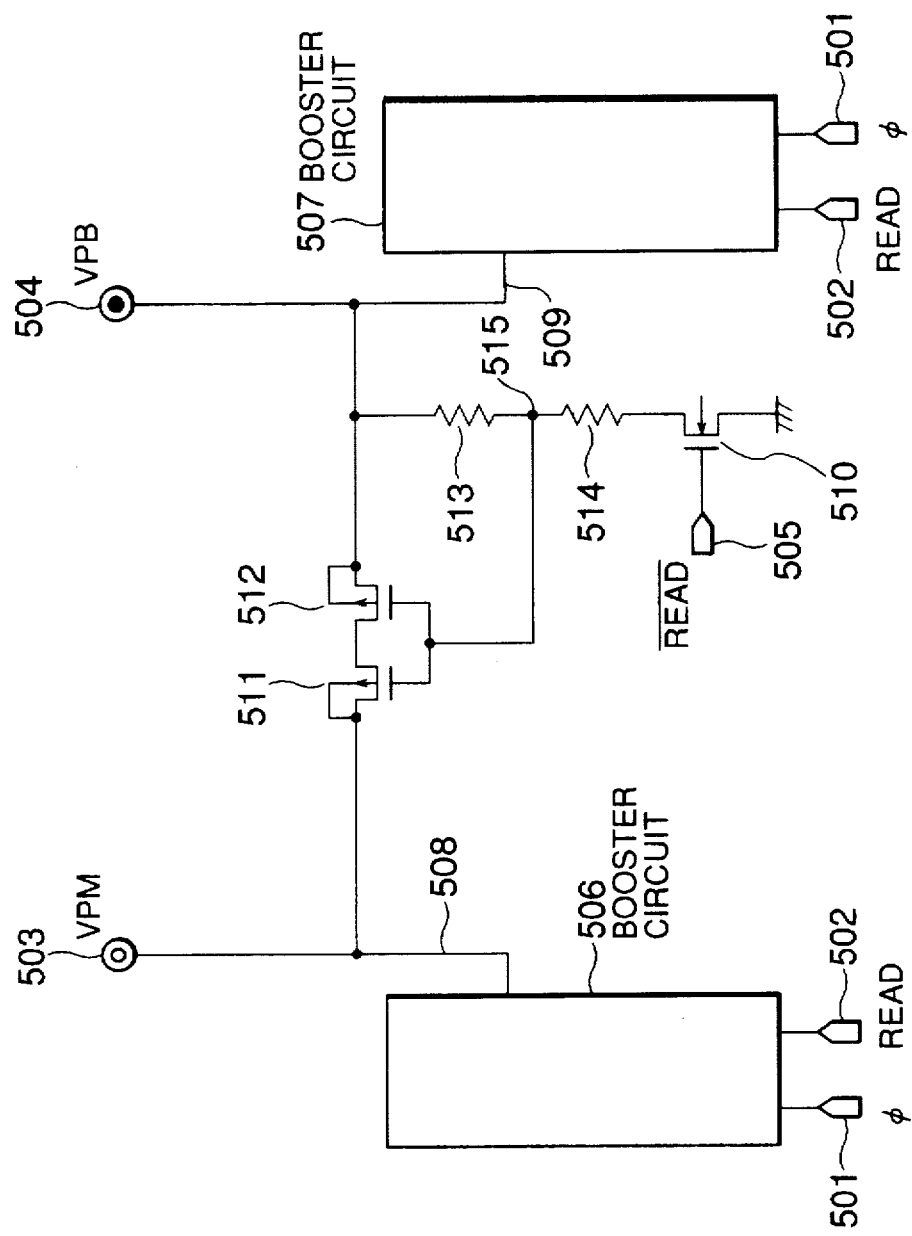
FIG. 5 is a circuit diagram for generating the charging voltage VPM and the back gate bias voltage VPB.

The charging voltage VPM and the back gate bias voltage VPB are supplied by a power circuit shown in FIG. 5. This power circuit comprises a booster circuit 506 which outputs the charging voltage VPM to an output terminal 503, a booster circuit 507 which outputs the back gate bias voltage VPB to an output terminal 504, p-channel MOS transistors 511 and 512 connected in series between the output terminals 503 and 504, with their gates connected in common connected to a node 515, a resistor 513 connected between the output terminal 504 and the node 515, and a resistor 514 and an n-channel MOS transistor 510 connected in series between the node 515 and the ground. The operation of the booster circuits 506 and 507 is controlled by a clock φ and a READ control signal 502. The gate terminal of the n-channel MOS transistor 510 receives the inverted signal 505 of the READ control signal. When the inverted signal 505 is in the nonactive state "H", both p-channel MOS transistors 511 and 512 are energized and identical voltage VPM is output to the output terminals 503 and 504, whereas when the inverted signal 505 is in the active state "L", both p-channel MOS transistors 511 and 512 are deenergized and the charging voltage VPM and the back gate bias voltage VPB are output to the output terminals 503 and 504, respectively.

Next, referring to FIG. 7, the read operation will be described.

First, the case where the word line corresponding to an input address signal 106 is selected will be described. In this embodiment, it will be assumed that the power supply voltage Vdd is 3[V], the back gate bias voltage VPB is 6[V], and the charging voltage VPM is 4[V], so the back gate voltage is given by 6[V]−4[V]=2[V], and the threshold Vtp of the p-channel MOS transistor is about −1.2[V] from FIG. 2.

Figure 3:
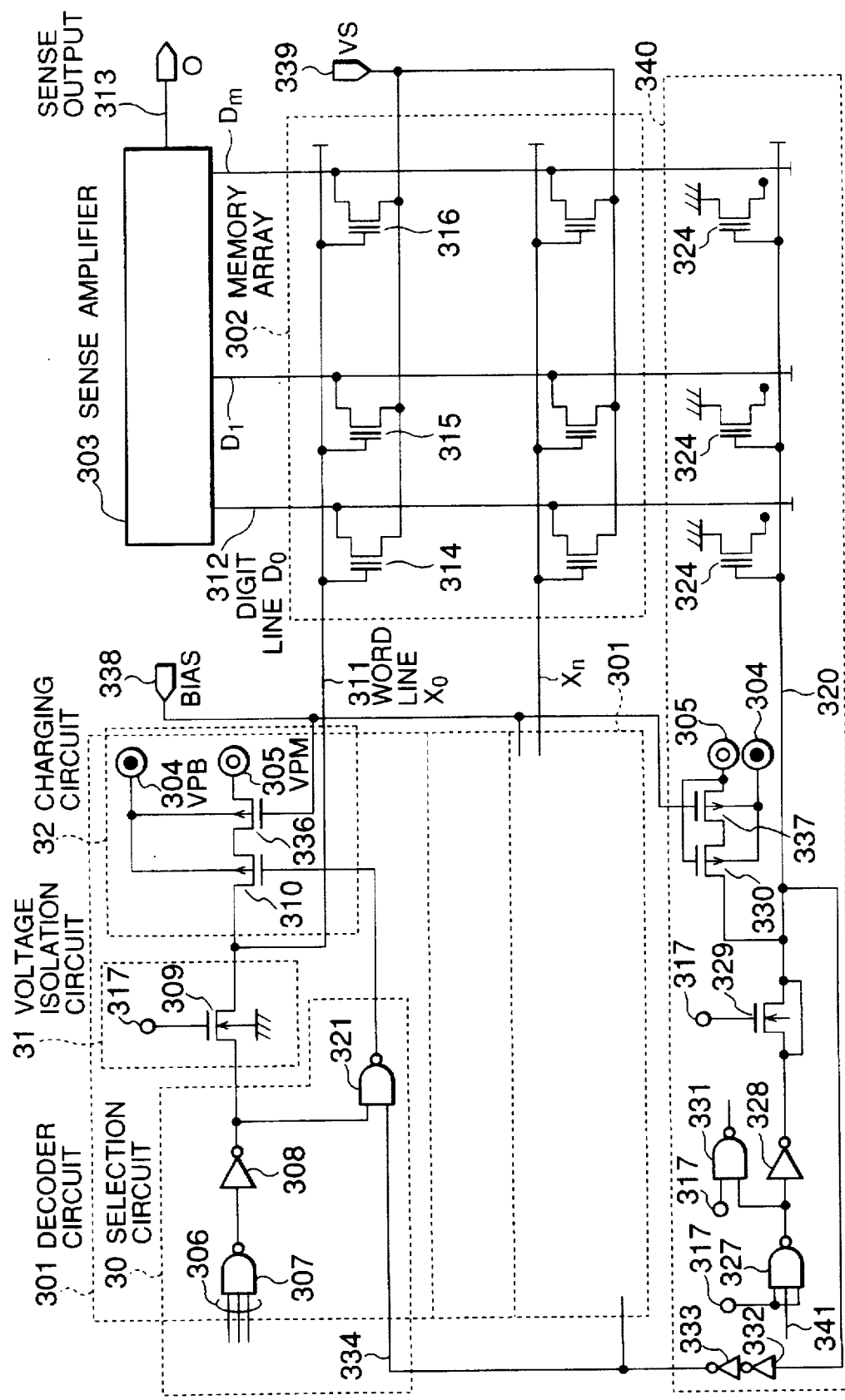
FIG. 3 is a circuit diagram according to a second embodiment of the invention.
Figure 4A:
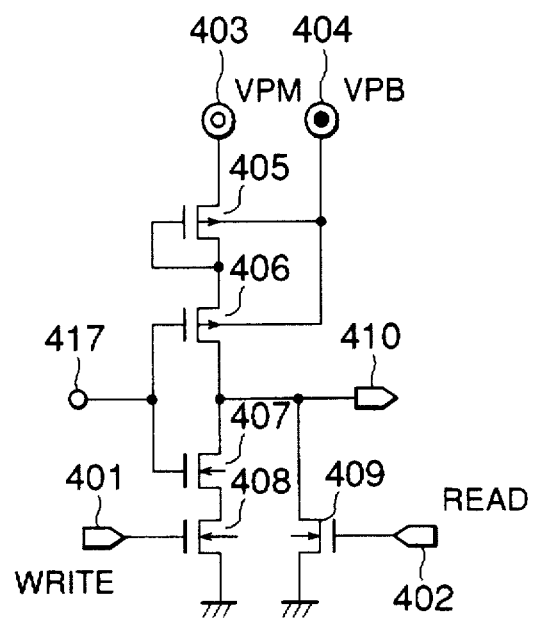
FIG. 4(a) is a circuit diagram of a control signal bias circuit.

The output of the logic gate 107 corresponding to the selected word line makes a transition from the power supply voltage Vdd (3[V]) to the ground potential (FIG. 7 1̇). Upon this change, the logic gate 108 drives the word line 111 through the n-channel MOS transistor 109 (FIG. 7 2̇), and when the output of the logic gate 107 goes to the ground potential, the p-channel MOS transistor 110 is energized and the selected word line is charged up to the charging voltage VPM (4[V]) (FIG. 7 2̇). Then, the memory cell 114 connected to the selected word line is energized and the digit line 112 is brought to the ground potential through the memory cell transistor (FIG. 7 3̇). The sense amplifier 103 detects the potential change in the digit line 112 and amplifies the signal, and outputs data based on the data of the memory cell 114 as the sense output 113 (FIG. 7 4̇).

In a word line which is not selected by the input address signal 106, the output of the logic gate 107 goes to the power supply voltage Vdd (3[V]), and the power supply voltage Vdd (3[V]) is applied to the gate of the p-channel MOS transistor 110. Here, a voltage of 4[V] as the charging voltage is supplied to one terminal of the source or drain of the p-channel MOS transistor 110. Accordingly, if the absolute value of the threshold Vtp of the p-channel MOS transistor 110 is smaller than |−1[V]|, the transistor 110 will be energized, but in reality a voltage of 6[V] is applied as the back gate bias voltage VPB, as mentioned above, so that its operating threshold is at −1.2[V] and hence the transistor goes to the deenergized state.

In this way, by applying the back gate bias voltage VPB to the back gate, it is possible to supply the changing voltage VPM higher than the power supply voltage Vdd only to a selected word line, and supply the ground potential to the nonselected word lines.

Figure 8:
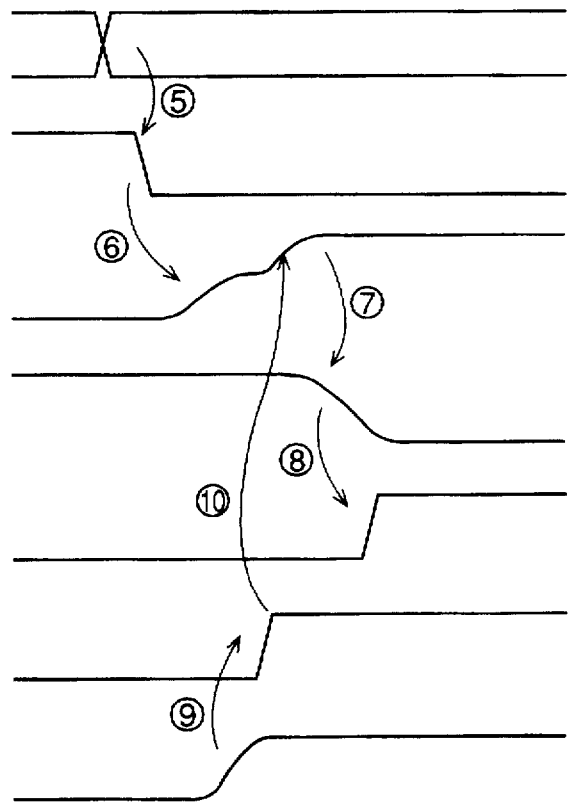
FIG. 8 is a timing chart showing the operation of the second embodiment of the invention.

As a second embodiment, the case of applying this invention to a semiconductor flash memory is shown in FIG. 3, and a timing chart for its operation is shown in FIG. 8.

The decoder circuit of this embodiment comprises a selection circuit 30, a voltage isolation circuit 31, and a charging circuit 32.

The selection circuit 30 comprises a NAND gate 307 which receives an input signal 306 and is operated under the power supply voltage Vdd, a NOT gate 308 which is operated by receiving the output of the gate 307, and a NAND gate 321 which receives the output of the NOT gate 308 as one of its inputs.

The voltage isolation circuit 31 is composed of an n-channel MOS transistor 309 which receives the power supply voltage Vdd to the gate terminal as a control signal, connects the back gate to the ground, and connects one of the terminals to the output of the NOT gate 308 and uses the other as the output terminal.

The charging circuit 32 comprises a p-channel MOS transistor 310 with its back gate connected to a terminal 304 supplying the back gate bias voltage VPB, its gate terminal connected to the output of the NAND gate 321, and uses the drain as its output terminal, and a p-channel MOS transistor 305 with its source terminal connected to a terminal 336 supplying the charging voltage VPM, its gate terminal connected to a terminal 338 supplying a control signal BIAS, and its drain terminal connected to the source terminal of the p-channel MOS transistor 310.

Figure 4B:
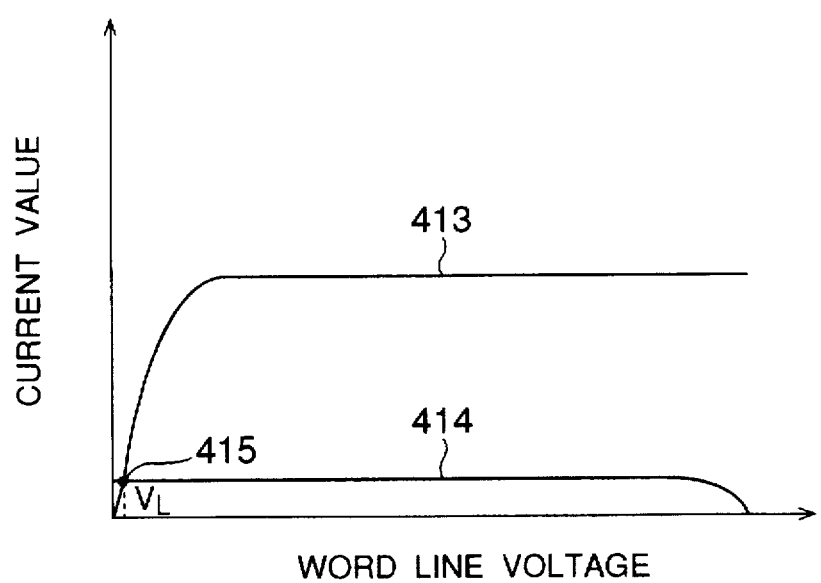
FIG. 4(b) is a characteristic diagram of the word line voltage during writing operation.

The control signal BIAS is generated by the circuit shown in FIG. 4. This circuit comprises a p-channel MOS transistor 405 with its source terminal connected to a terminal 403 and its gate and drain terminals connected with each other, a p-channel MOS transistor 406 with its gate terminal connected to a terminal 417 to which is supplied the power supply voltage Vdd, its source terminal connected to the drain terminal of the transistor 405, and its drain terminal connected to an output terminal 410, an n-channel MOS transistor 409 with its gate terminal connected to a control signal READ 402, its source terminal connected to the ground potential, and its drain terminal connected to an output terminal 410, an n-channel MOS transistor 408 with its gate terminal connected to a terminal 401 supplying a control signal WRITE and its source terminal connected to the ground potential, and an n-channel MOS transistor 407 with its gate terminal connected to the terminal 417, its drain terminal connected to the output terminal 410, and its source terminal connected to the drain terminal of the transistor 408, thereby the potential of the output terminal 410 is output as the control signal BIAS. During the read operation, the control signal READ 402 goes to the power supply voltage Vdd and the control signal WRITE 401 goes to the ground potential, so that the n-channel MOS transistor 409 is energized and the p-channel MOS transistor 406 is deenergized. Consequently, during the read operation the the potential of the output terminal 410, namely, that of the control signal BIAS goes to the ground potential. During the write operation, the control signal READ 402 goes to the ground potential and the control signal WRITE 401 goes to the power supply voltage Vdd, so that the n-channel MOS transistor 409 is deenergized and the p-channel MOS transistor 406 is energized. Note, however, that during the write operation the charging voltage VPM and the back gate bias voltage VPB are made to be identical voltage VPM by the action of the circuit in FIG. 5. Accordingly, a voltage slightly lower than the voltage VPM−|Vth| is output to the output terminal 410, so the selected word line is charged to the charging voltage VPM, whereas the nonselected word line goes to the voltage VL indicated by 415 in FIG. 4(b). In FIG. 4(b), the characteristic curve 414 represents the current-voltage (I–V) characteristic of the p-channel MOS transistor 336 during the write operation, and the characteristic curve 413 represents equivalently the I–V characteristic on the NOT gate connection side of the n-channel MOS transistor 309.

The output of the decoder circuit constructed in this way, namely, the drain terminal of the p-channel MOS transistor 310, is connected to a word line 311, and n-channel MOS transistors 314, 315, and 316 arranged in array form constitute one row of a memory cell array 302. The n-channel MOS transistor 314 and the like are connected to a digit line 312, and all digit lines under similar situation are connected to a sense amplifier 303 to produce a sense output 313.

At this point, a delay circuit 340 will be described. This delay circuit 340 comprises a pseudo decoder circuit, a pseudo memory array, and NOT gates 332 and 333 which receive the output of the pseudo decoder.

The pseudo decoder circuit comprises a pseudo selection circuit, a pseudo voltage isolation circuit, and a pseudo charging circuit. The output of the delay circuit 340 is connected to a pseudo word line 320 which is connected to a pseudo memory array consisting of n-channel MOS transistors 324 arranged in array form.

The pseudo selection circuit comprises a NAND gate 327 which receives a control signal 341 synchronized with a change in the address signal 306 and operates under the power supply voltage Vdd, a NOT gate 328 which operates by receiving the output of the gate 327, and a NAND gate 331 which receives the output of the NAND gate 327 to its input.

The pseudo voltage isolation circuit is composed of an n-channel MOS transistor 329 which receives the power supply voltage Vdd to the gate terminal as a control signal, receives the ground potential to the back gate, with one of the source and drain terminals connected to the output of the pseudo selection circuit and the other served as the output, and the source and drain terminals short-circuited.

The pseudo charging circuit comprises a p-channel MOS transistor 330 with its back gate connected to the terminal 304, its gate terminal connected to the terminal 305, and the drain terminal used as the output, and a p-channel MOS transistor 337 with its source terminal connected to the terminal 305, its gate terminal connected to the terminal 338, and its drain terminal connected to the drain terminal of the p-channel MOS transistor 330.

The output of the pseudo decoder circuit thus constructed, used via the NOT gates 332 and 333 as the output of the delay circuit 340, is input to the other terminal of the NAND gate 321 of the decoder circuit. As a result, a delay time almost equivalent to the drive time of the word line can be obtained by means of the delay circuit 340.

Next, referring to FIG. 8, the read operation will be described.

First, the case in which the word line corresponding to an input address signal 306 is selected will be described. Here again it will be assumed that the power supply voltage Vdd is 3[V], the back gate bias voltage VPB is 6[V], and the charging voltage VPM is 4[V], and that the threshold of the p-channel MOS transistors 310 and 336 is about −1.2[V].

Figure 6:
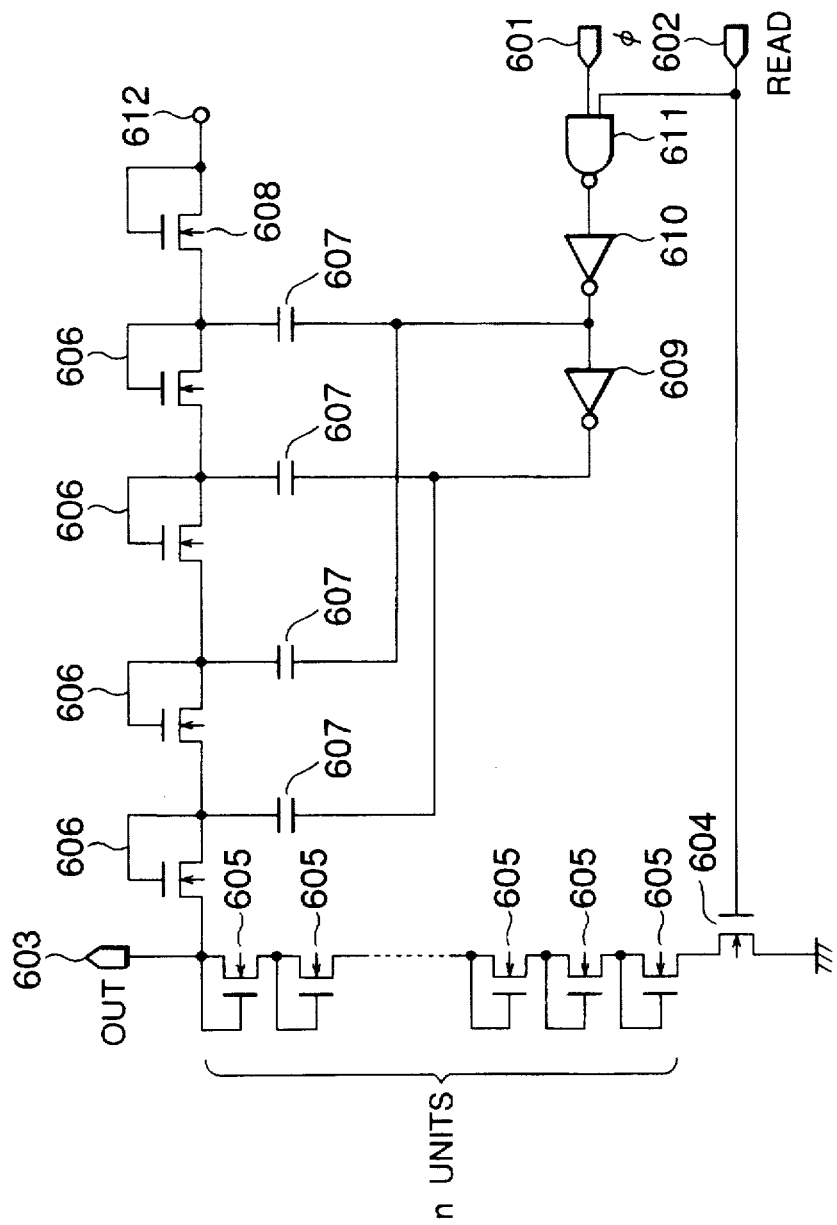
FIG. 6 is a circuit diagram of the booster circuit.
Figure 9:
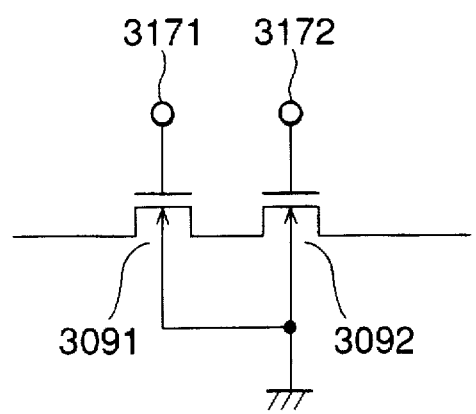
FIG. 9 is a circuit diagram of the voltage isolation circuit according to the invention.
Figure 10:
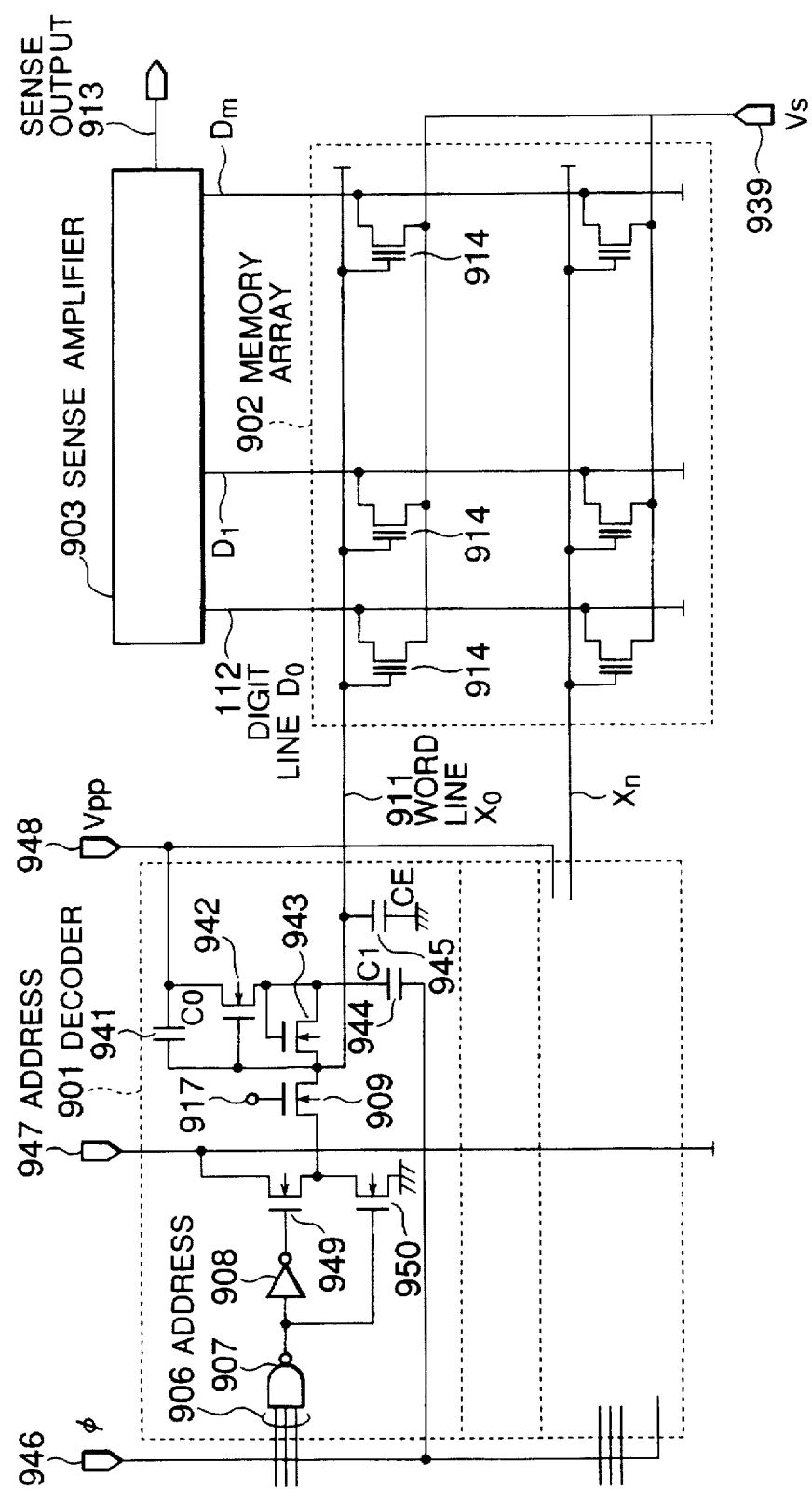
FIG. 10 is a circuit diagram of the prior art.
Figure 11:
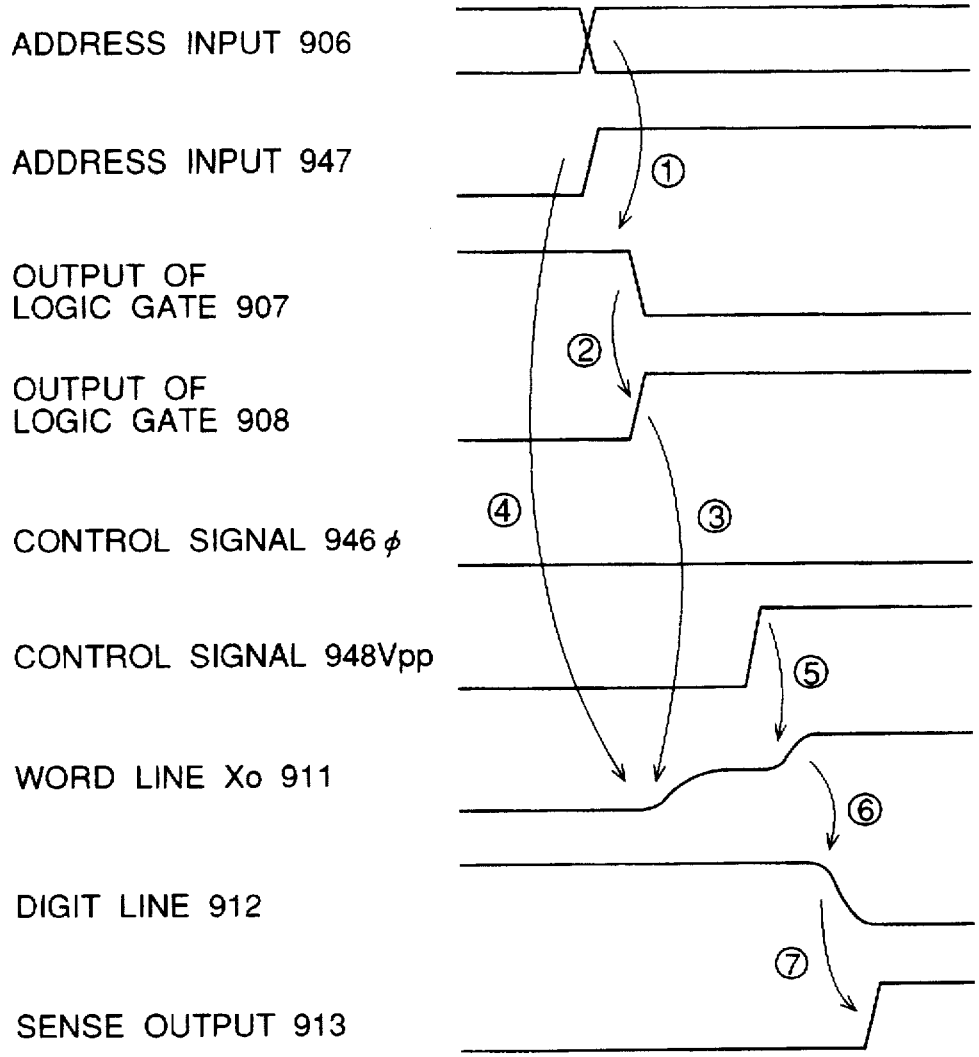
FIG. 11 is a timing chart showing the operation of the prior art.

The output of the logic gate 307 corresponding to the selected word line makes a transition from the power supply voltage Vdd to the ground potential (FIG. 8 5). Upon this change, the logic gate 308 drives the word line 311 via the n-channel MOS transistor 309 (FIG. 8 6). As the output of the logic gate 308 goes to the power supply voltage Vdd (3[V]), the output of the NAND gate 321 goes to the ground potential delayed by the time introduced by the delay circuit 340 and energizes the p-channel MOS transistor 310, which charges the selected word line 311 up to the charging voltage VPM (4[V]). The memory cells connected to the selected word line 311 are energized, and a digit line 312 goes to the ground potential via the memory cell 314 (FIG. 8 7). The sense amplifier 303 detects the potential change on the digit line 312, amplifies it, and outputs the result as the sense output 313 (FIG. 8 8). Incidentally, the additional rise in the potential of the word line 311 mentioned above is the result of the rise in the level of the control signal 334 in response to the rise in the potential of the output of the pseudo decoder 320 (FIG. 8 9), which induces a further rise in the potential of the selected word line 311 (FIG. 8 10)

In a word line which is not selected by the input address signal 306, the output of the logic gate 321 goes to the power supply voltage Vdd (3[V]), so the power supply voltage Vdd (3[V]) is applied to the gate terminal of the p-channel MOS transistor 310. Accordingly, the p-channel MOS transistor 310 is deenergized as in the first embodiment.

In this way, the selected word line can be charged in two steps, namely, first by the power supply voltage Vdd, then by the charging voltage VPM, as a result of provision of the delay circuit, so that the load on the booster circuit within the power circuit can be alleviated.

Next, during the write operation, a voltage, for example 10V, necessary for writing is generated by the booster circuit shown in FIG. 6, and the voltage of 10[V] is output as the charging voltage VPM and the back gate bias voltage VPB via the power circuit shown in FIG. 5. (Description will be given by assuming in this embodiment, although not shown in the power circuit in FIG. 5 and in the booster circuit in FIG. 6, that a plurality of different voltages can be taken out from the booster circuit in the writing and reading operations.). During the write operation the control signal BIAS input to the gate of the p-channel MOS transistor 336 has the value VPM−|Vtp|, so that the p-channel MOS transistor 336 is energized, and when selected, the p-channel MOS transistor 310 which receives the ground potential to the gate is also energized. As a result, the charging voltage VPM (10[V]) is applied to the selected word line 311. In this state, by applying the voltage of 10[V] to the digit line 312 to induce a current flow between the source and drain terminals of an intended memory cell 314, data write to the memory cell 314 is accomplished. In this case, a voltage is applied to the gate of the p-channel MOS transistor 310 in order to avoid the application of the charging voltage VPM (10[V]) to the nonselected word lines.

When such a high voltage of 10[V] is supplied to the selected word line 311, such a high voltage of charging voltage VPM 10[V]-power supply voltage Vdd 3[V]=7[V] is applied between the gate and the source of the n-channel MOS transistor 309. Since there is a possibility of breaking the n-channel MOS transistor 309 by this high voltage, n-channel MOS transistors 3091 and 3092 connected in series is used as a voltage isolation circuit instead of a single n-channel MOS transistor 309, as shown in FIG. 9. Here, the power supply voltage Vdd (3[V]) is supplied via a terminal 3171 to the gate terminal of the n-channel MOS transistor 3091 on the side closer to the NOT gate 308, and a voltage of 7[V] generated by the booster circuit is supplied via a terminal 3172 to the gate terminal of the n-channel MOS transistor 3092 on the side closer to the p-channel MOS transistor 310. As a result, only a potential difference of 3[V] is generated between the source terminal (10[V]) and the gate terminal (7[V]) of the n-channel MOS transistor 3092, and only a potential difference of 4[V]−Vtn is generated between the source terminal (7[V]–Vtn) and the gate terminal (3[V]) of the n-channel MOS transistor 3091, where Vtn denotes the threshold of the n-channel MOS transistor. In this way, it is possible to prevent the breakage of the n-channel MOS transistors by connecting a plurality of n-channel MOS transistors in series instead of a single n-channel MOS transistor 309 to reduce the potential difference applied between the gate and source terminals of the n-channel MOS transistors.

The use of the delay circuit 340 and the NAND gate 321 in the second embodiment is not limited to this embodiment alone, and is applicable also to the first embodiment. Moreover, the technique of employing the n-channel MOS transistors 3091 and 3092 may also be applied to the first embodiment depending upon, for example, the voltages supplied to the word lines.

In the first and second embodiments, cases of application of this invention to a ROM and a flash memory have been illustrated. However, this invention is not limited to be applied only to these cases, but is applicable to all circuits in which the application of voltages higher than the power supply voltage to the internal circuits is to be controlled.

As described in the above, there is no need for obtaining a transistor with especially high threshold through changes in the device requirements, by applying a back gate bias voltage to the MOS transistor for switching the charging condition to raise its threshold voltage. That is, there is no need for increasing the manufacturing manhours.

In addition, since provision of a capacitor for voltage step-up for each word line is no longer needed, it is possible to increase the charging voltage for the word line by the use of a very small space, and improve the read rate of data from the memory cells.

Moreover, it is possible to obtain a voltage which is not affected by the variations in the power supply voltage Vdd by arranging such that the voltage applied to the word line depends only on the charging voltage VPM, and generating the charging voltage VPM so as not to depend on the power supply voltage Vdd. Accordingly, malfunctions caused by the variations in the power supply voltage Vdd can also be prevented.

In this way, it is possible to control the application of a voltage higher than the power supply voltage to an internal circuit by means of a transistor in which a back gate bias voltage is applied to the back gate, thereby simplifying the circuit configuration.

Although the present invention has been fully described by way of the preferred embodiments thereof with reference to the accompanying drawings, various changes and modifications will be apparent to those having skills in this field Therefore, unless these changes and modifications otherwise depart from the scope of the present invention, they should be construed as included therein.

What is claimed is:

1. A semiconductor circuit including a first node to which is applied a first voltage higher than a power supply voltage, a second node, and a transistor connected between said first and second nodes to the back gate of which is applied a back gate bias voltage different from said first voltage, wherein the operating threshold of said transistor is arranged to be raised so as to make said transistor energized when a logic level with voltage lower than said power supply voltage is applied to its gate terminal and deenergized when a logic level with substantially the same voltage as said power supply voltage is applied to its gate terminal.

2. A semiconductor circuit having a decoder circuit which drives one of a plurality of word lines to selected level having a voltage higher than a power supply voltage and the remaining word lines to nonselected level based on input address information, the semiconductor circuit characterized in that said decoder circuit includes a plurality of first transistors whose respective source-drain paths are inserted between corresponding word lines of said plurality of word lines and respective circuit points where signals with said selected levels are provided, wherein the operating threshold of each of said plurality of first transistors is raised by supplying a back gate bias voltage different from the voltage of said selected level to the back gate of the transistor.

3. The semiconductor circuit as claimed in claim 2, wherein said decoder circuit further includes a plurality of means for supplying a first control signal showing whether said word line is in the selected or nonselected state to the gate of corresponding member of said first transistors, where when said word line is in the non-selected state, a first level of said first control signal is input to the gate terminal of said first transistor and said back gate bias voltage is applied so as to make the voltage value obtained by subtracting the voltage of said first level from that of said selected level is smaller than the operating threshold regulated by said back gate bias voltage, with the result that said first transistor goes to the deenergized state, and when said word line is in the selected state, a second level of said first control signal is input to the gate terminal of said first transistor and said back gate bias voltage is applied so as to make said first transistor go to the energized state.

4. The semiconductor circuit as claimed in claim 3, wherein said decoder circuit further includes a means for outputting a second control signal obtained by inverting said first control signal to a node, and a second transistor with its source and drain path connected between said node and said circuit point and its gate terminal supplied with said power supply voltage.

5. The semiconductor circuit as claimed in claim 4, wherein said decoder circuit further includes a third transistor connected in series with said first transistor between said circuit point and said word line, and said back gate bias voltage is supplied to the back gate of said third transistor.

6. The semiconductor circuit as claimed in claim 3, wherein said means is includes a gate means in which said first control signal is input to one of its terminals and a third control signal is input to the other terminal, and a delay circuit in which said third control signal is generated after elapse of a specified length of time in response to a signal input based on a change in said address information, and said first control signal is applied to said gate terminal of said first transistor when said third control signal is input to said gate means.

* * * * *